US012341000B2

(12) United States Patent
Okuno et al.

(10) Patent No.: US 12,341,000 B2
(45) Date of Patent: *Jun. 24, 2025

(54) SUBSTRATE PROCESSING APPARATUS AND RECORDING MEDIUM

(71) Applicant: KOKUSAI ELECTRIC CORPORATION, Tokyo (JP)

(72) Inventors: Masanori Okuno, Toyama (JP); Hideki Horita, Toyama (JP); Kazuyoshi Yamamoto, Toyama (JP); Kazuhide Asai, Toyama (JP); Toshihiko Yonejima, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 763 days.

This patent is subject to a terminal disclaimer.

(21) Appl. No.: 17/576,670

(22) Filed: Jan. 14, 2022

(65) Prior Publication Data

US 2022/0136497 A1    May 5, 2022

Related U.S. Application Data

(63) Continuation of application No. 16/228,116, filed on Dec. 20, 2018, now Pat. No. 11,236,743.

(30) Foreign Application Priority Data

Dec. 21, 2017 (JP) .................................. 2017-245066
Nov. 30, 2018 (JP) .................................. 2018-224852

(51) Int. Cl.
*H01L 21/02* (2006.01)
*F04B 37/14* (2006.01)
(Continued)

(52) U.S. Cl.
CPC ........ *H01L 21/02002* (2013.01); *F04B 51/00* (2013.01); *H01L 21/67017* (2013.01);
(Continued)

(58) Field of Classification Search
CPC ......... H01L 21/02002; H01L 21/67017; F04B 51/00; F04B 37/14; F04B 2201/12;
(Continued)

(56) References Cited

U.S. PATENT DOCUMENTS 11,236,743 B2 *   2/2022   Okuno .............. H01L 21/02002
2003/0154052 A1   8/2003   Samata
(Continued)

FOREIGN PATENT DOCUMENTS

JP    2000-259222 A    9/2000
JP    2003-077780 A    3/2003
(Continued)

OTHER PUBLICATIONS

Chinese Office Action issued on Oct. 26, 2022 for Chinese Patent Application No. 201811545130.8.
(Continued)

*Primary Examiner* — Charles G Freay
(74) *Attorney, Agent, or Firm* — Volpe Koenig

(57) ABSTRACT

There is provided a technique that includes: a controller configured to execute a process recipe including a plurality of steps to perform a predetermined process on a substrate. The controller acquires device data, which includes at least one of a current value, a rotational speed, and a back pressure of a pump, in a specific step among the plurality of steps and compares an acquired value of the device data with a previously acquired value of the device data. The controller generates a notification if at least one of the following conditions is met: the acquired value for the current value is larger than the previously acquired value for the current
(Continued)

value, the acquired value for the back pressure is larger than the previously acquired value for the back pressure, and the acquired value for the rotational speed is smaller than the previously acquired value for the rotational speed.

19 Claims, 7 Drawing Sheets

(51) Int. Cl.
*F04B 51/00* (2006.01)
*G05B 23/02* (2006.01)
*H01L 21/67* (2006.01)

(52) U.S. Cl.
CPC ............ *F04B 37/14* (2013.01); *F04B 2201/12* (2013.01); *F04B 2201/1201* (2013.01); *F04B 2203/0201* (2013.01); *F04B 2205/05* (2013.01); *F04B 2207/70* (2013.01); *G05B 23/0286* (2013.01)

(58) Field of Classification Search
CPC ...... F04B 2201/1201; F04B 2203/0201; F04B 2205/05; F04B 2207/70
See application file for complete search history.

(56) References Cited

U.S. PATENT DOCUMENTS

| | | |
|---|---|---|
| 2003/0158705 A1 | 8/2003 | Ishii et al. |
| 2007/0012099 A1 | 1/2007 | Becourt |
| 2008/0067146 A1 | 3/2008 | Onishi et al. |
| 2009/0035151 A1 | 2/2009 | Sugiura et al. |
| 2012/0226475 A1 | 9/2012 | Asai |
| 2013/0164943 A1 | 6/2013 | Koshi et al. |
| 2013/0171919 A1 | 7/2013 | Shinohara et al. |
| 2013/0304419 A1 | 11/2013 | Nakamura et al. |
| 2015/0096494 A1 | 4/2015 | Nishiura et al. |
| 2015/0176130 A1 | 6/2015 | Koshi et al. |
| 2015/0368794 A1 | 12/2015 | Morita et al. |
| 2016/0218026 A1 | 7/2016 | Kobayashi |

FOREIGN PATENT DOCUMENTS

| | | |
|---|---|---|
| JP | 2003-077907 A | 3/2003 |
| JP | 2006-190812 A | 7/2006 |
| JP | 2008-072030 A | 3/2008 |
| JP | 2012-054541 A | 3/2012 |
| JP | 2012-186213 A | 9/2012 |
| JP | 2013-153159 A | 8/2013 |
| JP | 2016-134585 A | 7/2016 |
| KR | 2013-0075677 A | 7/2013 |
| KR | 2014-0010686 A | 1/2014 |
| TW | 201245909 A | 11/2012 |

OTHER PUBLICATIONS

Korean Office Action issued on May 13, 2020 for Korean Patent Application No. 10-2018-0165018.
Japanese Office Action dated Nov. 1, 2019, for Japanese Patent Applicatio No. 2018-224852.
Taiwanese Office Action issued Oct. 5, 2019 for the Taiwanese Patent Application No. 107145119.

* cited by examiner

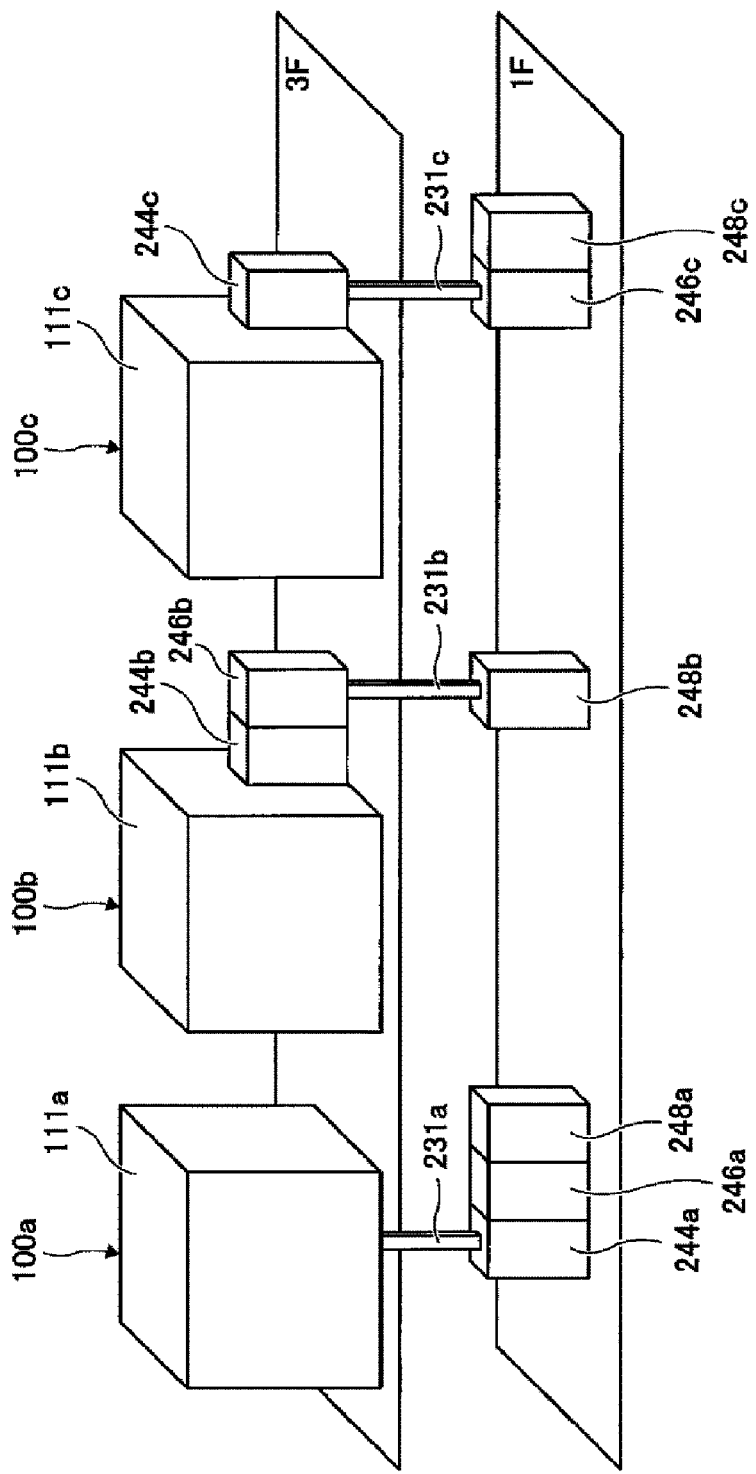

US 12,341,000 B2

SUBSTRATE PROCESSING APPARATUS AND RECORDING MEDIUM

CROSS-REFERENCE TO RELATED APPLICATIONS

This application is a continuation application of U.S. patent application Ser. No. 16/228,116, filed on Dec. 20, 2018 which is based upon and claims the benefit of priority from Japanese Patent Application Nos. 2017-245066 and 2018-224852, filed on Dec. 21, 2017 and Nov. 30, 2018, respectively, the entire contents of which are incorporated herein by references.

TECHNICAL FIELD

The present disclosure relates to a substrate processing apparatus and a recording medium.

BACKGROUND

In conventional processes, an influence by the conductance of an exhaust pipe was not so large. However, improvement of the exhaust performance has been regarded as important in recent processes concerning large area 3D devices. For example, there is provided a structure including airtight chambers (load lock chambers) which are air-tightly installed in succession via a process chamber and an opening, and an exhaust device (pump) directly attached to each of the load lock chambers to exhaust the atmosphere of the process chamber by the pump.

However, if by-products are adhered to and deposited on the exhaust device, the device may be stopped even during production. As a result, in some case, the product substrates may be out of lot, or the production process may be interrupted to disassemble and clean the exhaust device.

SUMMARY

Some embodiments of the present disclosure provide a technique capable of improving the device workability by removing by-products adhered to an exhaust device at an appropriate timing.

According to one of the embodiments of the present disclosure, there is provided a technique that includes: a main controller configured to execute a process recipe including a plurality of steps to perform a predetermined process on a substrate so as to acquire device data when executing the process recipe; and a storage part configured to store the acquired device data, wherein the main controller is configured to: acquire the device data in a predetermined specific step among the steps constituting the process recipe; calculate a value of the acquired device data in the specific step; compare the calculated value with a value of the device data in the specific step calculated at a time of previous execution of the process recipe; and generate an alarm when the calculated value shows a predefined tendency.

BRIEF DESCRIPTION OF DRAWINGS

FIG. 7 is a view showing another configuration example of the substrate processing apparatus according to the embodiments of the present disclosure.

DETAILED DESCRIPTION

One or More Embodiments of the Present Disclosure

The embodiments of the present disclosure will be now described.

(1) Configuration of Substrate Processing Apparatus

The configuration of a substrate processing apparatus 100 according to the embodiments of the present disclosure will be described with reference to FIGS. 1 and 2.

Figure 1:
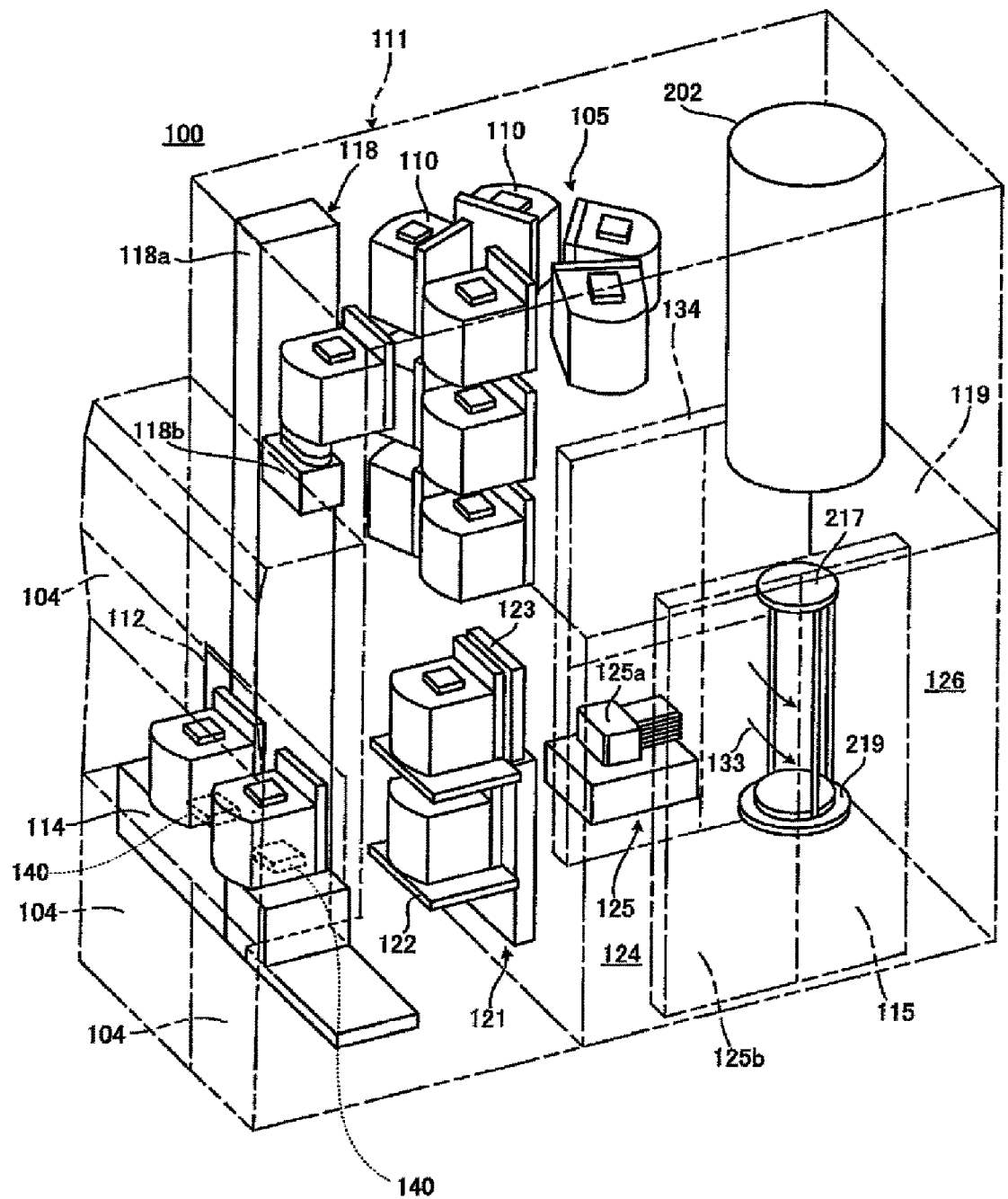
FIG. 1 is a perspective view showing a substrate processing apparatus suitably used in one or more embodiments of the present disclosure.

As shown in FIG. 1, the substrate processing apparatus 100 includes a housing 111 configured as a pressure resistant container. An opening for maintenance is formed in the front wall of the housing 111, and a pair of front maintenance doors 104 as an access mechanism for opening and closing the opening is installed in the opening. A pod (substrate container) 110 that contains a wafer (substrate) 200 such as silicon is used as a carrier for transferring the wafer 200 into/out of the housing 111.

A pod loading/unloading port is formed on the front wall of the housing 111 so as to communicate the inside and outside of the housing 111. A load port 114 is installed in the pod loading/unloading port. The pod 110 is placed and aligned on the load port 114.

A rotary pod shelf 105 is installed at an upper portion in the substantially central portion inside the housing 111. A plurality of pods 110 is stored on the rotary pod shelf 105. The rotary pod shelf 105 includes a post vertically erected and rotated in a horizontal plane, and a plurality of shelf plates radially supported at respective positions of the upper, middle and lower stages on the post.

A pod transfer device 118 is installed between the load port 114 and the rotary pod shelf 105 in the housing 111. The pod transfer device 118 transfers the pod 110 between the load port 114, the rotary pod shelf 105, and a pod opener 121 by a continuous operation of a pod transfer mechanism 118*b* and a pod elevator 118*a*, which can move up and down while holding the pod 110.

A sub-housing 119 is installed at a lower portion in the housing 111 to extend from the substantially central portion to the rear end inside the housing 111. A pair of pod openers 121 for transferring the wafer 200 into/out of the sub-housing 119 is installed on the front wall of the sub-housing 119.

Each pod opener 121 includes a mounting table on which the pod 110 is mounted, and a cap attaching/detaching mechanism 123 for attaching/detaching a cap of the pod 110.

The pod opener 121 is configured to open and close a wafer entrance of the pod 110 by attaching/detaching the cap of the pod 110 mounted on the mounting table by the cap attaching/detaching mechanism 123.

A transfer chamber 124, which is fluidly isolated from a space where the pod transfer device 118, the rotary pod shelf 105 and the like are installed, is formed inside the sub-housing 119. A wafer transfer mechanism (substrate transfer mechanism) 125 is installed in a front region of the transfer chamber 124. The wafer transfer mechanism 125 includes a wafer transfer device (substrate transfer device) 125a that can rotate or directly move the wafer 200 in the horizontal direction, and a wafer transfer device elevator 125b that raises and lowers the wafer transfer device 125a. The wafer transfer device elevator 125b is installed between the right end of the front region of the transfer chamber 124 of the sub-housing 119 and the right end of the housing 111. The wafer transfer device 125a includes a tweezer as a holding part of the wafer 200. The wafer 200 can be loaded (charged)/unloaded (discharged) onto/from a boat 217 as a substrate holder by a continuous operation of the wafer transfer device elevator 125b and the wafer transfer device 125a.

Figure 2:
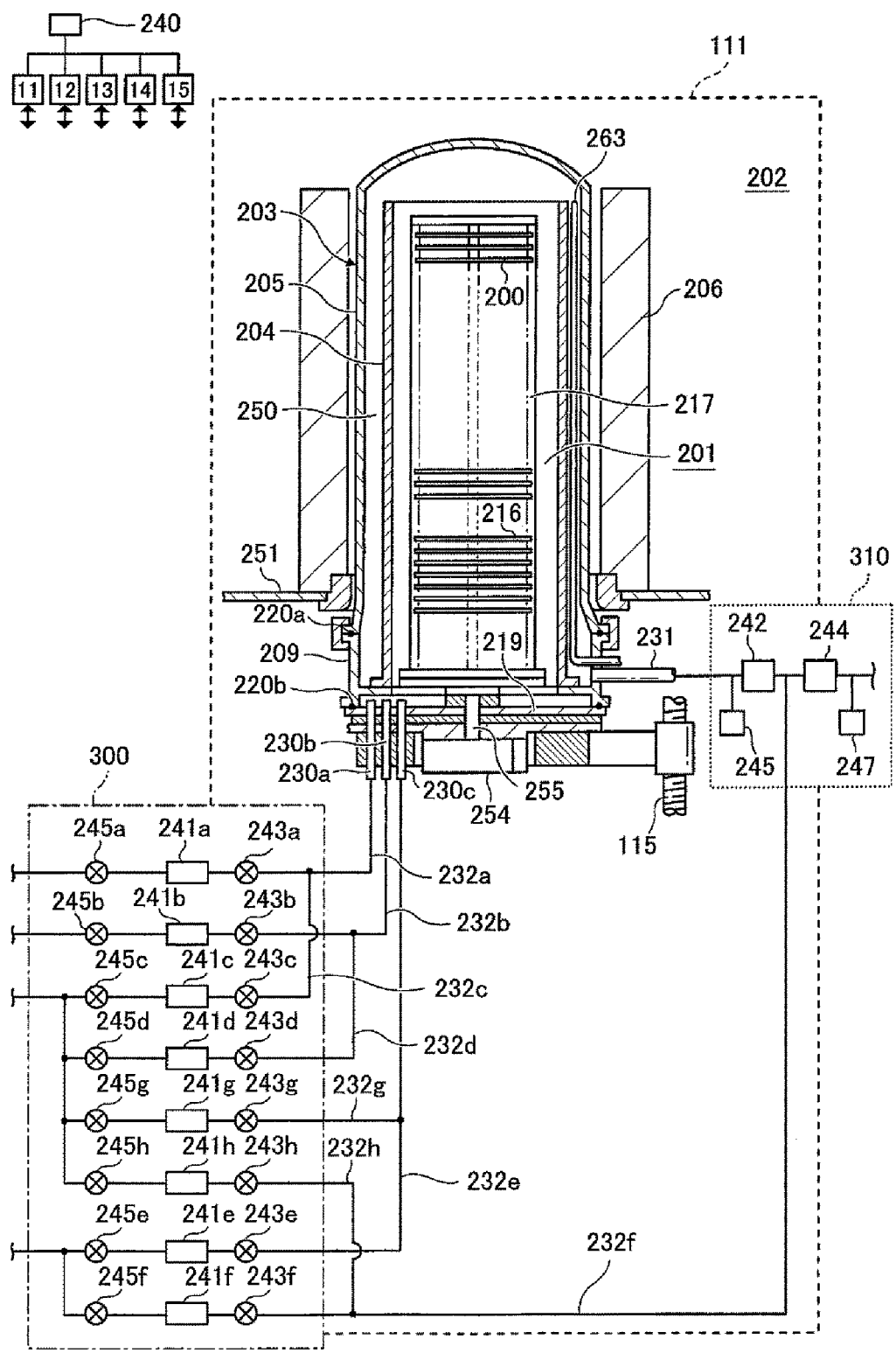
FIG. 2 is a longitudinal sectional view showing a process furnace of the substrate processing apparatus according to the embodiments of the present disclosure.

As shown in FIGS. 1 and 2, a boat elevator 115 for raising and lowering the boat 217 is installed in the sub-housing 119 (the transfer chamber 124). A process furnace 202 is installed above a standby part 126 that accommodates the boat 217 and makes it stand by. An arm is connected to an elevating base of the boat elevator 115. A seal cap 219 as a lid is horizontally installed on the arm. The seal cap 219 vertically supports the boat 217 and is configured to close the lower end portion of the process furnace 202.

As shown in FIG. 1, a clean unit 134 is installed in the side of the wafer transfer device elevator 125b of the transfer chamber 124 and the left end opposite to the side of the boat elevator 115. The clean unit 134 is configured to supply clean air 133 which is a cleaned atmosphere or an inert gas.

The clean air 133 blown out from the clean unit 134 circulates around the wafer transfer device 125a and the boat 217 in the standby part 126. Thereafter, the circulated clean air 133 is sucked in by a duct (not shown) and is exhausted to the outside of the housing 111, or is circulated up to the primary side (supply side) which is the suction side of the clean unit 134 and is blown again into the transfer chamber 124 by the clean unit 134.

(2) Configuration of Process Furnace

As shown in FIG. 2, the process furnace 202 includes a process tube 203 as a reaction tube. The process tube 203 includes an inner tube 204 as an inner reaction tube, and an outer tube 205 as an outer reaction tube formed outside the inner tube 204. The inner tube 204 is formed in a cylindrical shape with its upper end and lower end opened. A process chamber 201 for processing the wafers 200 is formed in a hollow cylindrical portion of the inner tube 204. The process chamber 201 is configured to accommodate the boat 217.

A heater 206 is installed outside the process tube 203 so as to surround the side wall surface of the process tube 203. The heater 206 is formed in a cylindrical shape. The heater 206 is installed vertically by being supported by a heater base 251 as a holding plate.

A manifold 209 as a furnace opening is disposed below the outer tube 205 so as to be concentric with the outer tube 205. The manifold 209 is formed in a cylindrical shape with its upper end and lower end opened. The manifold 209 is installed to support the lower end portion of the inner tube 204 and the lower end portion of the outer tube 205, and is engaged with the lower end portion of the inner tube 204 and the lower end portion of the outer tube 205. An O-ring 220a as a seal member is installed between the manifold 209 and the outer tube 205. As the manifold 209 is supported on the heater base 251, the process tube 203 is vertically installed. A reaction container is formed by the process tube 203 and the manifold 209.

The seal cap 219 capable of air-tightly closing the lower end opening of the manifold 209 is formed in a disc shape below the manifold 209. An O-ring 220b as a seal member which is adjacent to the lower end of the manifold 209 is installed on the upper surface of the seal cap 219.

A rotation mechanism 254 for rotating the boat 217 is installed near the central portion of the seal cap 219 and on the side opposite to the process chamber 201. A rotary shaft 255 of the rotation mechanism 254 passes through the seal cap 219 and supports the boat 217 from below. The rotation mechanism 254 is configured to rotate the wafer 200 by rotating the boat 217.

The seal cap 219 is configured to be moved up/down in the vertical direction by the boat elevator 115 installed outside the process tube 203. By moving the seal cap 219 up/down, the boat 217 can be transferred into/out of the process chamber 201.

A transfer mechanism according to the present embodiment mainly includes the rotary pod shelf 105, the boat elevator 115, the pod transfer device 118, the wafer transfer mechanism 125, the boat 217 and the rotation mechanism 254. The rotary pod shelf 105, the boat elevator 115, the pod transfer device 118, the wafer transfer mechanism 125, the boat 217 and the rotation mechanism 254 are electrically connected to a transfer controller 11.

The boat 217 is configured to support a plurality of wafers 200 in such a state that the wafers 200 are arranged in a horizontal posture and in multiple stages with the centers of the wafers 200 aligned with one another. The boat 217 is made of a heat resistant material such as quartz or silicon carbide. In the lower portion of the boat 217, a plurality of heat insulating plates 216 as heat insulating members are arranged in a horizontal posture and in multiple stages. Each heat insulating plate 216 is formed in a disc shape and is made of a heat resistant material such as quartz or silicon carbide. The heat insulating plate 216 is provided to make it difficult for heat from the heater 206 to be delivered to the manifold 209 side.

A temperature sensor 263 as a temperature detector is installed in the process tube 203. A heating mechanism according to the present embodiment mainly includes the heater 206 and the temperature sensor 263. A temperature controller 12 is electrically connected to the heater 206 and the temperature sensor 263.

A nozzle 230a, a nozzle 230b and a nozzle 230c are connected to the manifold 209 so as to communicate to the inside of the process chamber 201. Gas supply pipes 232a, 232b and 232e are connected to the nozzles 230a, 230b and 230c, respectively.

Gas supply sources (not shown), valves 245a and 245b, MFCs 241a and 241b and valves 243a and 243b are installed in the gas supply pipes 232a and 232b, respectively, in order from the upstream side of gas flow. Gas supply pipes 232c and 232d are connected to the downstream side of the valves 243a and 243b of the gas supply pipes 232a and 232b, respectively. Purge gas supply sources (not shown), valves 245c and 245d, MFCs 241c and 241d and valves 243c and 243d are installed in the gas supply pipes 232c and 232d, respectively, in order from the upstream side of gas flow.

A cleaning gas supply source (not shown), a valve 245e, an MFC 241e and a valve 243e are installed in the gas supply pipe 232e in order from the upstream side of gas flow. A gas supply pipe 232f is connected to the upstream side of the valve 245e of the gas supply pipe 232e. A valve 245f, an MFC 241f and a valve 243f are installed in the gas supply pipe 232f in order from the upstream side of gas flow. The downstream side of the gas supply pipe 232f is connected to the upstream side of an auxiliary pump 244 as a first exhaust device of an exhaust unit 310 as an exhaust system and the downstream side of an APC (Auto Pressure Controller) valve 242 as a pressure regulator. Gas supply pipes 232g and 232h are connected to the downstream side of the valves 243e and 243f of the gas supply pipes 232e and 232f, respectively. Purge gas supply sources (not shown), valves 245g and 245h, MFCs 241g and 241h, valves 243g and 243h are installed in the gas supply pipes 232g and 232h, respectively, in order from the upstream side of gas flow.

However, the present disclosure is not limited to such embodiments. Although not shown, the gas supply pipe 232f may be installed on the upstream side of the APC valve 242. Further, a gas supply pipe 232f1 may be installed on the upstream side of the APC valve 242, and a gas supply pipe 232f2 may be installed on the downstream side of the APC valve 242 and on the upstream side of the auxiliary pump 244.

A processing gas supply system according to the present embodiments mainly includes the gas supply source (not shown), the valve 245a, the MFC 241a, the valve 243a, the gas supply pipe 232a and the nozzle 230a. A reaction gas supply system according to the present embodiments mainly includes the gas supply source (not shown), the valve 245b, the MFC 241b, the valve 243b, the gas supply pipe 232b and the nozzle 230b. A purge gas supply system according to the present embodiments mainly includes the purge gas supply source (not shown), the valves 245c, 245d, 245g and 245h, the MFCs 241c, 241d, 241g and 241h, the valves 243c, 243d, 243g and 243h, the gas supply pipes 232c, 232d, 232g and 232h, and the nozzles 230a and 230b. A cleaning gas supply system according to the present embodiments mainly includes the cleaning gas supply system (not shown), the valve 245e, then MFC 241e, the valve 243e, the gas supply pipe 232e and the nozzle 230c. An exhaust cleaning gas supply system according to the present embodiments mainly includes the cleaning gas supply source (not shown), the valve 245f, the MFC 241f, the valve 243f and the gas supply pipe 232f. A gas supply unit 300 as a gas supply system according to the present embodiments mainly includes the processing gas supply system, the reaction gas supply system, the purge gas supply system, the cleaning gas supply system and the exhaust cleaning gas supply system. A gas supply controller 14 is electrically connected to the MFCs 241a to 241h, the valves 243a to 243h and the valves 245a to 245h.

In the present embodiments, the cleaning gas supply system and the exhaust cleaning gas supply system are connected to one cleaning gas supply source (not shown), but it is also possible that the cleaning gas supply system and the exhaust cleaning gas supply system are connected to each of cleaning gas supply sources (not shown), respectively.

The exhaust pipe 231 for exhausting the atmosphere of the process chamber 201 is installed in the manifold 209. The exhaust pipe 231 is disposed at the lower end portion of a cylindrical space 250 formed by a gap between the inner tube 204 and the outer tube 205. The exhaust pipe 231 communicates to the cylindrical space 250. In the exhaust pipe 231, a pressure sensor 245 as a pressure detector, an APC valve 242, an auxiliary pump 244, a pressure sensor 247 and a main pump (not shown) as a second exhaust device are installed in order from the upstream side (the process chamber 201 side) of gas flow. The auxiliary pump 244 is used to assist the operation of the main pump (not shown), such as increasing an exhaust speed to exhaust the atmosphere of the process chamber 201. As the auxiliary pump 244, for example, a booster pump or the like can be used. The pressure sensor 247 measures the back pressure of the auxiliary pump 244.

The exhaust unit 310 includes the exhaust pipe 231, the pressure sensor 245, the APC valve 242, the auxiliary pump 244 and the pressure sensor 247. Further, the exhaust unit 310 may include a main pump (not shown).

A pressure controller 13 is electrically connected to the APC valve 242 and the pressure sensor 245. An exhaust controller 15 is electrically connected to the pressure sensor 247, the auxiliary pump 244 and the main pump (not shown).

In brief, as shown in FIG. 2, the substrate processing apparatus 100 includes at least the housing 111, the gas supply unit 300 and the exhaust unit 310.

As shown in FIG. 2, the controller 240 as a control part is connected to the transfer controller 11, the temperature controller 12, the pressure controller 13, the gas supply controller 14 and the exhaust controller 15.

(3) Configuration of Controller 240

Figure 3:
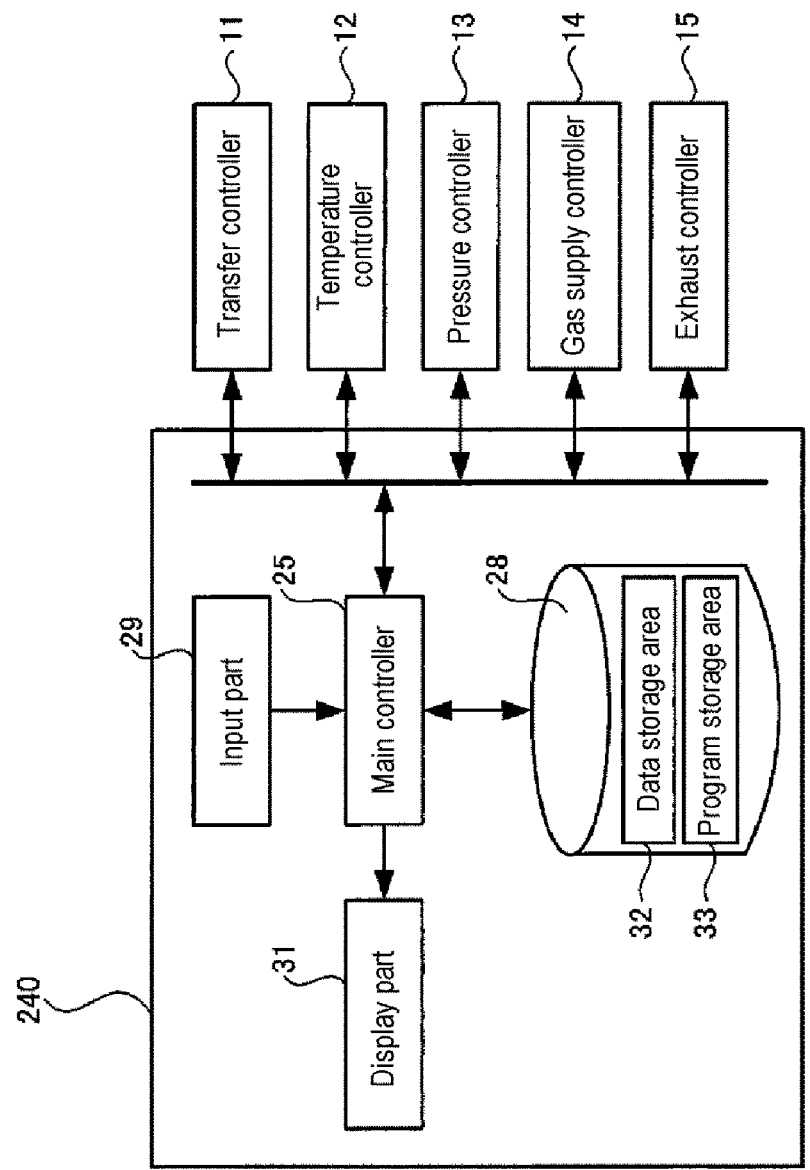
FIG. 3 is a block diagram showing a control configuration used in the substrate processing apparatus according to the embodiments of the present disclosure.

The control configuration of the controller 240 will be described below with reference to FIG. 3.

The controller 240 mainly includes a main controller 25 such as a CPU (Central Processing Unit), a storage part 28 such as a memory (RAM) and a hard disk, an input part 29 such as a mouse and a keyboard, and a display part 31 such as a monitor. The main controller 25, the storage part 28, the input part 29 and the display part 31 constitute an operation part capable of setting respective data.

The storage part 28 includes a data storage area 32 where various processing data such as device data are stored, and a program storage area 33 where various programs are stored. The processing data may be data generated by operating each of the component parts when the substrate processing apparatus 100 processes the wafer 200, such as data related to substrate processing such as a processing temperature, a processing pressure, a flow rate of a processing gas, and the like when the substrate processing apparatus 100 processes the wafer 200, data related to quality of the substrate as the manufactured product (for example, film thickness, accumulated value of the film thickness, and the like), or apparatus data related to the component parts (quartz reaction tube, heater, valve, MFC, and the like) of the substrate processing apparatus 100. The device data will be described below.

Various parameters related to recipe files are stored in the data storage area 32. Various processing data is stored in the data storage area 32. In the present embodiments, data indicating the state of the exhaust unit 310 under execution of process recipes among the various processing data are accumulated and stored in the data storage area 32. Specifically, the device data such as current values, rotational speeds, back pressures and the like of the auxiliary pump 244 are accumulated and stored in the data storage area 32. In addition, the average values of current values, rotational speeds and back pressures of the auxiliary pump 244 in a predetermined specific step of the process recipes are stored in the data storage area 32. Further, a tendency indicating the abnormality of the exhaust unit 310 and a monitoring parameter by which at least a predetermined set value (number of times) is defined is stored in the data storage area 32 for each device data type such as the current value, rotational speed, back pressure and the like of the auxiliary pump 244. As the tendency indicating the abnormality from each component constituting interior of the exhaust unit 310, each variation in the average value of current values, the average value of rotational speeds, and the average value of back pressures of the auxiliary pump 244 in the predetermined specific step is set.

Further, various programs necessary for controlling devices including a process recipe, a cleaning recipe, an exhaust cleaning recipe and the like are stored in the program storage area 33.

The process recipe used herein refers to a recipe including a plurality of steps, in which processing conditions, processing procedures and the like for processing the wafer 200 are defined. The cleaning recipe used herein refers to a recipe in which processing conditions, processing procedures and the like for cleaning the process chamber 201 for processing the wafer 200 are defined. The exhaust cleaning recipe used herein refers to a recipe for bypassing the process chamber 201 and directly supplying a cleaning gas to the exhaust pipe 231 in the exhaust unit 310, in which processing conditions, processing procedures and the like for cleaning e.g., the exhaust pipe 231 are defined.

Setting values (control values), transmission timings and the like to be transmitted to the transfer controller 11, the temperature controller 12, the pressure controller 13, the gas supply controller 14, the exhaust controller 15 and the like are set in the recipe file for each step.

The display part 31 is provided with a touch panel. The touch panel is configured to display an operation screen for receiving input of operation commands to the above-described substrate transfer system, substrate processing system and the like. The operation part may be configured to include at least the display part 31 and the input part 29, such as an operation terminal (terminal device) as a personal computer and a mobile terminal.

The main controller 25 has a function of controlling the temperature and the pressure of the process chamber 201, the flow rate of the processing gas introduced to the process chamber 201, and the like so as to carry out a predetermined process on the wafer 200 loaded to the process chamber 201.

That is, the main controller 25 executes the control program stored in the storage part 28 and executes the recipes (for example, the process recipe as a substrate processing recipe, the cleaning recipe, etc.) stored in the storage part 28 according to an input from the input part 29 or an instruction from an upper-level controller such as an external host computer or the like. In addition, the main controller 25 monitors the device data while executing the process recipe. When the abnormality from each component constituting the interior of the exhaust unit 310 is detected after the executed process recipe is completed, the exhaust cleaning recipe stored in the storage part 28 is executed.

The data is related to the exhaust unit 310 that exhausts the atmosphere of the process chamber 201, and at least one device data is selected from the group of a current value, a rotational speed, and a back pressure of the auxiliary pump 244 at a predetermined specific step, and set as the monitoring parameter. In addition, plural device data may be selected from the group of the current value, the rotational speed and the back pressure of the auxiliary pump 244.

Further, the main controller 25 acquires device data at a predetermined specific step of the process recipe at predetermined intervals. Then, the main controller 25 calculates the average value of the acquired device data. Then, the main controller 25 compares the calculated average value with an average value of the device data in a specific step, which is calculated at the time of executing the previous process recipe. Then, by referring to the monitoring parameter stored in the storage part 28, if the calculated average value shows a predefined tendency in succession for a preset number of times, the main controller 25 controls to generate an alarm and notify a message to the host device. Further, the main controller 25 controls to generate the alarm when the predefined tendency in each device data changes. Further, the main controller 25 controls to display the message on the display part 31 and display contents of the alarm. Further, while generating the alarm, the main controller 25 controls to execute the exhaust cleaning recipe after the end of the executed process recipe.

Note that the device data type of the monitoring parameter, the tendency indicating the abnormality that is a predefined tendency, and the setting value (number of times) that is a preset number of times can be independently set for each device data, for example, in the operation part. Further, each parameter such as the above-described device data type defined in the monitoring parameter can be set remotely from an external computer in addition to setting from the operation part of the main controller 25.

The transfer controller 11 is configured to control the transfer operations of the rotary pod shelf 105, the boat elevator 115, the pod transfer device 118, the wafer transfer mechanism 125, the boat 217 and the rotation mechanism 254, which constitute the transfer mechanism for transferring the substrate. Sensors are built in the rotary pod shelf 105, the boat elevator 115, the pod transfer device 118, the wafer transfer mechanism 125, the boat 217 and the rotation mechanism 254, respectively. If the sensors indicate predetermined values or abnormal values, the transfer controller 11 is configured to notify the fact to the controller 240.

The temperature controller 12 is configured to adjust the internal temperature of the process furnace 202 by controlling the temperature of the heater 206 of the process furnace 202. In addition, if the temperature sensor 263 shows a predetermined value or an abnormal value, the temperature controller 12 is configured to notify the fact to the controller 240.

The pressure controller 13 is configured to control the APC valve 242 based on a pressure value detected by the pressure sensor 245, so that the pressure of the process chamber 201 becomes a desired pressure at a desired timing. In addition, if the pressure sensor 245 shows a predetermined value or an abnormal value, the pressure controller 13 is configured to notify the fact to the controller 240.

The gas supply controller 14 is configured to control the MFCs 241a to 241h so that the flow rate of a gas supplied into the process chamber 201 becomes a desired flow rate at a desired timing. In addition, if sensors (not shown) of the MFCs 241a to 241h and the like indicate predetermined values or abnormal values, the gas supply controller 14 is configured to notify the fact to the controller 240. Further, the gas supply controller 14 is configured to control the opening/closing of the valves 243a to 243h and the valves 245a to 245h.

The exhaust controller 15 is configured to control the auxiliary pump 244 and the main pump (not shown) so as to discharge the atmosphere of the process chamber 201 to the outside of the process chamber 201. In addition, the exhaust controller 15 is configured to monitor a current value and a rotational speed of the auxiliary pump 244 and a back pressure of the auxiliary pump 244 detected by the pressure sensor 247 and transmit their variations to the controller 240.

(4) Operation of Substrate Processing Apparatus

Subsequently, the operation of each of the parts constituting the substrate processing apparatus 100 will be described with reference to FIGS. 1 to 3. The operation of each of the parts constituting the substrate processing apparatus 100 is controlled by the controller 240.

As shown in FIG. 1, when the pod 110 is supplied to the load port 114 by an in-process transfer device (not shown), the pod 110 is detected by a substrate detection sensor 140 and the pod loading/unloading port is opened by a front shutter. Then, the pod 110 on the load port 114 is loaded into the housing 111 from the pod loading/unloading port by the pod transfer device 118.

The pod 110 loaded into the housing 111 is automatically transferred and temporarily stored on the shelf plate of the rotary pod shelf 105 by the pod transfer device 118. Thereafter, the pod 110 is transferred from the shelf plate onto the mounting table of one pod opener 121. The pod 110 loaded into the housing 111 may be directly transferred onto the mounting table of the pod opener 121 by the pod transfer device 118.

The lid of the pod 110 mounted on the mounting table is removed by the cap attaching/detaching mechanism 123 to open the wafer entrance. Thereafter, the wafer 200 is picked up from the inside of the pod 110 by the tweezer of the wafer transfer device 125a via the wafer entrance, aligned in azimuth by a notch aligning device (not shown), transferred to the standby part 126 located in the rear side of the transfer chamber 124, and then loaded (charged) to the boat 217. After loading the wafer 200 into the boat 217, the wafer transfer device 125a returns to the mounting table on which the pod 110 is mounted, takes out the next wafer 200 from the inside of the pod 110, and loads it to the boat 217.

During the work of loading of the wafer 200 onto the boat 217 by the wafer transfer mechanism 125 in the one (upper or lower) pod opener 121, another pod 110 is transferred and mounted by the pod transfer device 118 from the rotary pod shelf 105 onto the mounting table of the other (lower or upper) pod opener 121, and the opening operation of the pod 110 by the pod opener 121 is performed at the same time.

When a preset number of wafers 200 are loaded into the boat 217 (wafer charging), a substrate-processing process to be described below is executed. When a film-forming process is completed, the processed wafer 200 is taken out from the boat 217 and stored in the pod 110 (wafer discharging).

After the wafer discharging, the pod 110 storing the processed wafer 200 is unloaded to the outside of the housing 111 in a procedure substantially opposite to the above-described procedure except for the aligning process in the notch aligning device.

(5) Substrate-Processing Process

Next, the substrate-processing process will be described in detail. When performing the substrate-processing process, the main controller 25 executes the process recipe stored in the program storage area 33 of the storage part 28.

Here, an example in which a film is formed on the wafer 200 by alternately supplying a first processing gas (precursor gas) and a second processing gas (reaction gas) to the wafer 200 will be described.

Hereinafter, an example in which a silicon nitride film ($Si_3N_4$ film, hereinafter also referred to as a SiN film) is formed on the wafer 200 using a hexachlorodisilane ($Si_2Cl_6$, abbreviation: HCDS) gas as a precursor gas and an ammonia ($NH_3$) gas as a reaction gas will be described. In the following description, the operation of each of the parts constituting the substrate processing apparatus 100 is controlled by the controller 240.

In the substrate-processing process in this embodiment, a SiN film is formed on the wafer 200 by performing a cycle a predetermined number of times (once or more), and the cycle includes non-simultaneously performing a step of supplying an HCDS gas to the wafer 200 of the process chamber 201, a step of removing the HCDS gas (residual gas) from the process chamber 201, a step of supplying an $NH_3$ gas to the wafer 200 of the process chamber 201, and a step of removing the $NH_3$ gas (residual gas) from the process chamber 201.

In the present disclosure, the term "substrate" is synonymous with the term "wafer."

(Boat-Loading Process)

When a plurality of wafers 200 are loaded onto the boat 217 (wafer charging), the boat 217 is loaded to the process chamber 201 by the boat elevator 115 (boat loading). At this time, the seal cap 219 air-tightly closes (seals) the lower end of the manifold 209 via the O-ring 220b.

(Preparing Process)

The process chamber 201, that is, the space where the wafer 200 exists, is vacuum-exhausted (evacuated) by the auxiliary pump 244 and the main pump (not shown) so that the process chamber 201 becomes a predetermined pressure (degree of vacuum) from the atmospheric pressure. At this time, the pressure of the process chamber 201 is measured by the pressure sensor 245, and the APC valve 242 is feedback-controlled based on the measured pressure information. The back pressure of the auxiliary pump 244 is measured by the pressure sensor 247. The auxiliary pump 244 and the main pump (not shown) maintain an ever-operated state at least until the processing on the wafer 200 is completed.

Further, the process chamber 201 is heated by the heater 206 so that the wafer 200 in the process chamber 201 has a predetermined temperature. At this time, the state of supplying electric power to the heater 206 is feedback-controlled based on the temperature information detected by the temperature sensor 263 so that the process chamber 201 has a predetermined temperature distribution. The heating of the process chamber 201 by the heater 206 is continued at least until the processing on the wafer 200 is completed.

Further, rotation of the boat 217 and the wafer 200 by the rotation mechanism 254 is started. As the boat 217 is rotated by the rotation mechanism 254, the wafer 200 is rotated. The rotation of the boat 217 and the wafer 200 by the rotation mechanism 254 is continued at least until the processing on the wafer 200 is completed.

(Purging Process)

Then, the valves 245c, 243c, 245d, 243d, 245g and 243g are opened, and the $N_2$ gas is supplied to the process chamber 201 from the nozzles 230a, 230b and 230c and is exhausted from the exhaust unit 310. The $N_2$ gas acts as a purge gas. Thus, the process chamber 201 is purged.

(Film-Forming Process)

When the temperature of the process chamber 201 is stabilized at a preset processing temperature, the following two steps, that is, steps 1 and 2, are sequentially executed.

[Step 1]

In this step, an HCDS gas is supplied to the wafer 200 in the process chamber 201.

The valves 245a and 243a are opened to flow the HCDS gas to the gas supply pipe 232a. With the flow rate of the HCDS gas adjusted by the MFC 241a, the HCDS gas is supplied to the process chamber 201 via the nozzle 230a and is exhausted from the exhaust unit 310. At this time, the HCDS gas is supplied to the wafer 200. At the same time, the valves 245c and 243c are opened to flow a $N_2$ gas into the gas supply pipe 232c. With the flow rate of the $N_2$ gas adjusted by the MFC 241 c, the $N_2$ gas is supplied together with the HCDS gas to the process chamber 201 and is exhausted from the exhaust pipe 231. By supplying the HCDS gas to the wafer 200, for example, a silicon (Si)-containing layer having a thickness of several atomic layers is formed as a first layer on the outermost surface of the wafer 200.

After the first layer is formed, the valves 245a and 243a are closed to stop the supply of the HCDS gas. At this time, with the APC valve 242 kept opened, the process chamber 201 is vacuum-exhausted by the auxiliary pump 244 and the main pump (not shown), so that the HCDS gas remaining at the process chamber 201, which has not reacted or which has contributed to the formation of the first layer, is discharged from the process chamber 201. At this time, with the valves 245c and 243c kept opened, the supply of the $N_2$ gas to the process chamber 201 is maintained. The $N_2$ gas acts as a purge gas. Thus, the effects of discharging the gas remaining at the process chamber 201 from the process chamber 201 can be enhanced.

[Step 2]

After Step 1 is completed, an $NH_3$ gas is supplied to the wafer 200 of the process chamber 201, that is, the first layer formed on the wafer 200. The $NH_3$ gas is activated by heat and is supplied to the wafer 200.

In this step, the opening/closing control of the valves 245b, 243b, 245d and 243d is performed in the same procedure as the opening/closing control of the valves 245a, 243a, 245c and 243c in Step 1. With the flow rate of the $NH_3$ gas adjusted by the MFC 241b, the $NH_3$ gas is supplied into the process chamber 201 via the nozzle 230b and is exhausted from the exhaust pipe 231. At this time, the $NH_3$ gas is supplied to the wafer 200. The $NH_3$ gas supplied to the wafer 200 reacts with at least a portion of the first layer formed on the wafer 200, that is, the Si-containing layer, in Step 1. As a result, the first layer can be thermally nitrided with non-plasma so as to be changed (modified) to a second layer, that is, a silicon nitride layer (SiN layer).

After the second layer is formed, the valves 245b and 243b are closed to stop the supply of the $NH_3$ gas. Then, according to the same processing procedure as in step 1, the $NH_3$ gas remaining at the process chamber 201, which has not reacted or which has contributed to the formation of the second layer, and reaction by-products are discharged from the process chamber 201. At this time, as in Step 1, it is not necessary to completely discharge the gas or the like remaining at the process chamber 201.

(Performing a Predetermined Number of Times)

A SiN film having a predetermined film thickness can be formed on the wafer 200 by performing a cycle a predetermined number of times (n times), and the cycle includes the above-described two steps which are performed in a non-simultaneous or asynchronous manner. Further, the thickness of the second layer (SiN layer) formed per cycle may be made smaller than a predetermined film thickness, and the above cycle may be repeated a plurality of times until the film thickness of a SiN film formed by laminating the second layers (SiN layers) reaches the predetermined film thickness.

(Purging Process)

After the film-forming process is completed, the valves 245c, 243c, 245d, 243d, 245g and 243g are opened, and a $N_2$ gas is supplied to the process chamber 201 from the nozzles 230a, 230b and 230c and is exhausted from the exhaust pipe 231. The $N_2$ gas acts as a purge gas. As a result, the process chamber 201 is purged to remove the gas and reaction by-products remaining at the process chamber 201 from the process chamber 201 (purging). Thereafter, the atmosphere of the process chamber 201 is replaced with an inert gas (inert gas replacement), and the internal pressure of the process chamber 201 is returned to the atmospheric pressure (returning to atmospheric pressure).

(Boat Unloading and Wafer Discharging)

The seal cap 219 is moved down by the boat elevator 115 to open the lower end of the process tube 203. Then, the processed wafer 200 supported by the boat 217 is unloaded from the lower end of the process tube 203 outside of the process tube 203 (boat unloading). The processed wafer 200 is taken out from the boat 217 (wafer discharging).

(6) Cleaning Process

The cleaning process is performed to remove by-products adhered to the component constituting the process chamber 201. When performing the cleaning process, the main controller 25 executes the cleaning recipe stored in the program storage area 33 of the storage part 28.

A method of cleaning the process chamber 201 using a fluorine ($F_2$) gas as a cleaning gas in the cleaning process in this embodiment will be described below.

Specifically, the lower end portion of the process furnace 202 is closed by a furnace port shutter in a state where the empty boat 217 is loaded to the process chamber 201 or in a state where the boat 217 is not loaded to the process chamber 201. Then, the process chamber 201 is vacuum-exhausted by the APC valve 242 so as to have a predetermined cleaning pressure, and is heated by the heater 206 so as to have a predetermined cleaning temperature.

Then, in a state where the process chamber 201 is maintained at the predetermined cleaning temperature and the predetermined cleaning pressure, the supply of a $F_2$ gas to the process chamber 201 is started.

Specifically, in a state where the valves 243a to 243d. 243g, 243h, 245a to 245d, 245g and 245h are closed to stop the supply of the processing gas, the reaction gas and the inert gas into the process chamber 201, the valves 243e and 245e are opened to flow the $F_2$ gas into the gas supply pipe 232e. In addition, with flow rate of the $F_2$ gas adjusted by the MFC 241e, the $F_2$ gas is supplied to the process chamber 201 via the nozzle 230c and is exhausted from the exhaust unit 310. At this time, the $F_2$ gas is supplied to the process chamber 201. At this time, the valves 245f and 243f are closed. At the same time, the valves 245c, 243c, 245d and 243d may be opened to flow a $N_2$ gas into the gas supply pipes 232a and 232b. With flow rate of the $N_2$ gas adjusted by the MFCs 241c and 241d, the $N_2$ gas is supplied together with the $F_2$ gas to the process chamber 201 and is exhausted from the exhaust pipe 231.

That is, the $F_2$ gas supplied into the process chamber 201 rises in the process chamber 201, flows out from the upper end opening of the inner tube 204 into the cylindrical space 250, flows down through the cylindrical space 250, and then is exhausted from the exhaust unit 310. When passing through the interior of the process chamber 201, the $F_2$ gas comes into contact with by-products adhered to the interior of the process chamber 201 to etch the by-products away. When a preset processing time elapses and the removal of the by-products is completed, the valves 245e and 243e are closed to stop the supply of the $F_2$ gas into the process chamber 201.

(7) Exhaust-Cleaning Process

The exhaust-cleaning process is performed to remove by-products adhered to the component such as the exhaust pipe 231 constituting the exhaust unit 310, the auxiliary pump 244, the main pump and the like. When the above-described film-forming process is repeated, by-products such as a SiN film are adhered to the component constituting the exhaust unit 310. When the by-products are adhered to and deposited on the component constituting the exhaust unit 310, the exhaust pipe 231 may be blocked or the auxiliary pump 244 or the main pump may be clogged. In this case, the apparatus must be stopped for maintenance and the production process will be interrupted. Even if a threshold value is set for maintenance of the device, it is difficult to set the threshold value.

Figure 4:
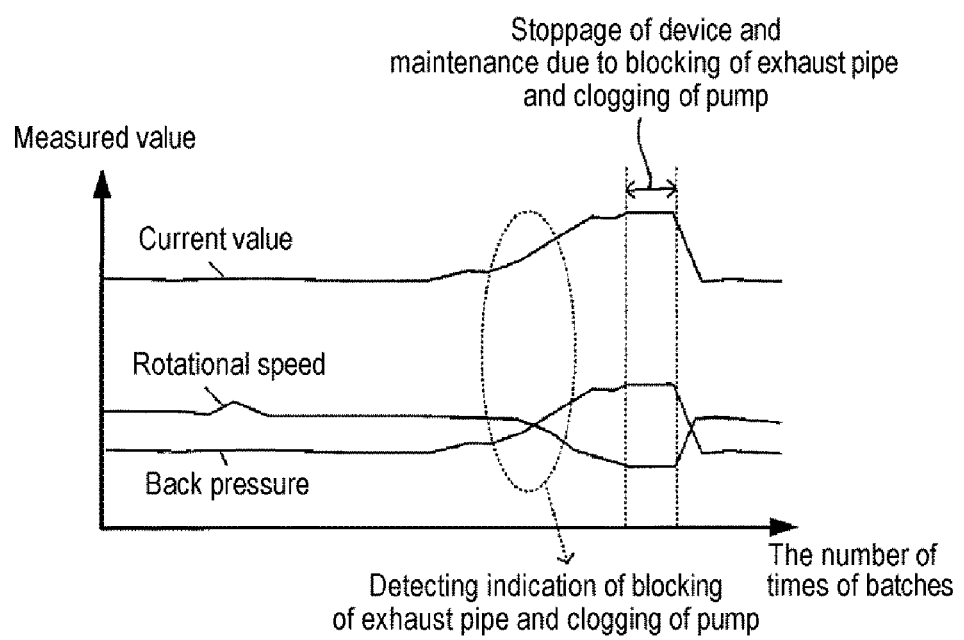
FIG. 4 is a view showing a current value, a rotational speed and a back pressure of an auxiliary pump during execution of a process recipe according to the embodiments of the present disclosure.

In the present embodiments, when acquiring the device data indicating the state of the exhaust unit 310 during execution of the process recipe and detecting an indication of blocking of the exhaust pipe 231 or an indication of clogging of pumps such as the auxiliary pump 244 and the main pump, the main controller 25 controls to perform the cleaning process on the interior of the exhaust unit 310 after the executed process recipe is completed. Specifically, for example, as shown in FIG. 4, the main controller 25 acquires the device data such as the current value, the rotational speed and the back pressure of the auxiliary pump 244 during execution of the process recipe. Then, upon detecting the indication of the blocking of the exhaust pipe 231 or the indication of the clogging of the pumps, the main controller 25 controls to perform the exhaust-cleaning process, which is the cleaning for the exhaust unit 310, before the apparatus is stopped due to the blocking of the exhaust pipe 231 or the clogging of the pumps and after the executed process recipe is completed.

When executing the exhaust-cleaning process, the main controller 25 executes the exhaust cleaning recipe stored in the program storage area 33 of the storage part 28.

Specifically, in a state where the valves 243a to 243e, 243g, 243h, 245a to 245e. 245g and 245h are closed to stop the supply of the processing gas, the reaction gas, the inert gas and the cleaning gas to the process chamber 201, the valves 245f and 243f are opened to flow the $F_2$ gas as a cleaning gas into the gas supply pipe 232f With flow rate of the $F_2$ gas adjusted by the MFC 241f, the $F_2$ gas bypasses the process chamber 201 and is exhausted from the exhaust unit 310.

That is, the $F_2$ gas is exhausted to the outside of the housing 111, through the gas supply pipe 232f, via the exhaust pipe 231, the pressure sensor 245, the APC valve 242, the auxiliary pump 244, the pressure sensor 247 and the main pump. In other words, when passing through the exhaust unit 310, the $F_2$ gas comes in contact with by-products adhered to the interior of the exhaust unit 310 to etch the by-products away. When a preset processing time elapses and the removal of the by-products is completed, the valves 245f and 243f are closed to stop the supply of the $F_2$ gas into the exhaust unit 310.

That is, based on the device data such as the current value, the rotational speed and the back pressure of the auxiliary pump 244, the main controller 25 can detect clogging caused by the by-products adhered to the exhaust unit 310 before the exhaust pipe 231 is blocked or before a pump rotor is stopped due to clogging of the pumps such as the auxiliary pump 244 and the main pump. Further, the main controller 25 can generate an alarm to notify a user of an indication of blocking of the exhaust pipe 231 or an indication of stoppage of the pump rotor due to clogging of the pumps, display the contents of the alarm on the display part 31 or notify the indication to the host device. At the same time, the main controller 25 can reserve the execution of the exhaust cleaning recipe and automatically execute the exhaust cleaning recipe when the executed process recipe is completed.

Figure 5:
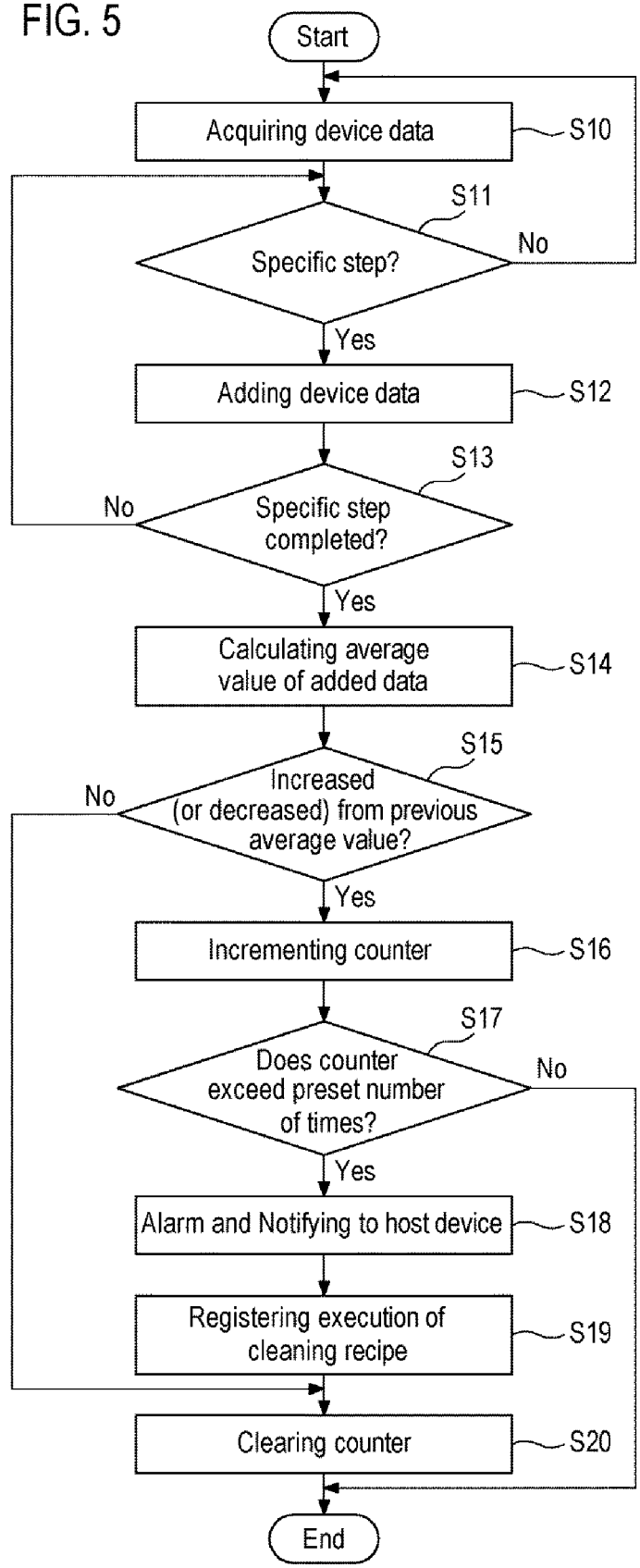
FIG. 5 is a view showing a control flow during execution of a process recipe used in the substrate processing apparatus according to the embodiments of the present disclosure.

Next, the execution operation of the exhaust cleaning recipe of the controller 240 will be described with reference to FIGS. 5 and 6. FIG. 5 is a view showing a control flow during execution of the process recipe used in the substrate processing apparatus according to the embodiments of the present disclosure.

Figure 6:
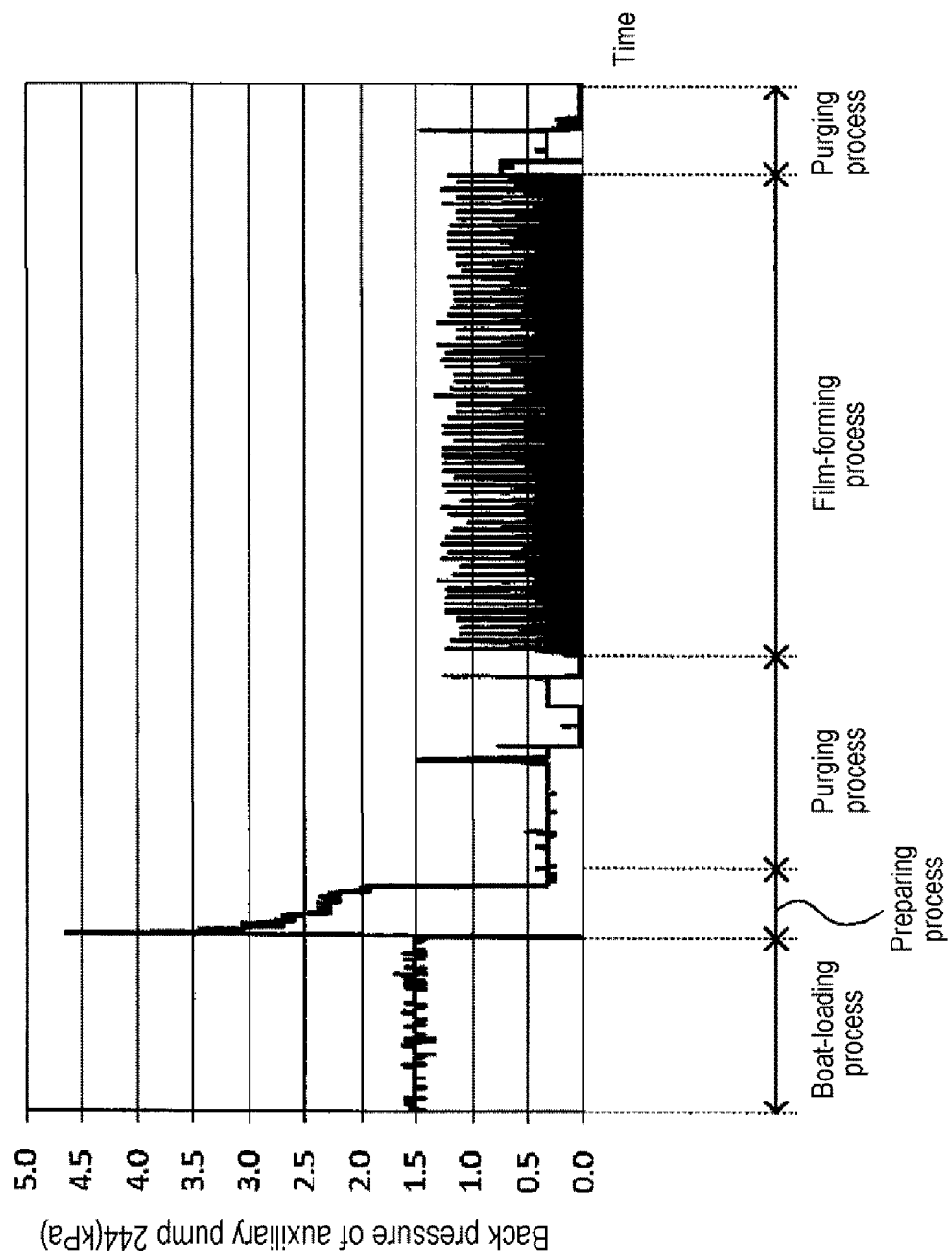
FIG. 6 is a view showing the back pressure of the auxiliary pump during execution of the process recipe shown in FIG. 5.

FIG. 6 is a view showing the back pressure of the auxiliary pump 244 monitored during execution of the process recipe. As shown in FIG. 6, during execution of the process recipe, in the preparing process of starting evacuation from the atmospheric pressure, the back pressure of the auxiliary pump 244 suddenly rises and a load is applied to the auxiliary pump 244. In the following description, an example of setting this preparation process as a specific step will be described. In addition, when a monitoring parameter corresponds to at least one selected from the group of a case where the current value of the auxiliary pump 244 in the preparing process tends to increase five times in succession, a case where the rotational speed of the auxiliary pump 244 tends to decrease three times in succession, and a case where the back pressure of the auxiliary pump 244 tends to increase five times in succession, a case where it is determined that the exhaust unit 310 is abnormal will be described by way of an example. In addition, the maximum value of the device data at a specific step may be acquired as the monitoring parameter. For example, if the maximum value is an abnormal value, an alarm may be generated to prevent continuous batch processing.

The main controller 25 acquires the device data during execution of the process recipe from the start of the process recipe (step S10). Specifically, as the device data, data indicating the current value, the rotational speed and the back pressure of the auxiliary pump 244 during execution of the process recipe are acquired at least at predetermined intervals.

Then, it is determined whether or not the recipe being executed is a predetermined specific step (step S11). Specifically, it is determined whether or not it is a preparing process (Slow Pump process).

When it is determined that it is not the specific step (No in step S11), the process returns to step S10. When it is determined that it is the specific step (Yes in step S11), the device data acquired at the predetermined intervals in the specific step are added (step S12).

Then, it is determined whether or not the specific step has been completed (step S13). When it is determined that the specific step has not been completed (No in step S13), the process returns to step S11.

When it is determined that the specific step has been completed (Yes in step S13), the main controller 25 calculates the average value of the added device data and stores it in the storage part 28 (step S14). Specifically, the current value, the rotational speed and the back pressure of the auxiliary pump 244 during the preparing process are acquired and added at intervals of one second. Then, by dividing the accumulated value of the added data by the number of additions, the average value is calculated and stored in the storage part 28.

Then, the average value of the added data calculated this time is compared with the average value of the added data calculated when executing the previous process recipe (step S15). Specifically, the average values of the current values, the rotational speeds and the back pressures of the auxiliary pump 244 in the preparing process this time are compared with the average values of the current values, the rotational speeds and the back pressures of the auxiliary pump 244 in the previous preparing process of the process recipe, respectively.

Then, the monitoring parameter stored in the storage part 28 is confirmed. When it is determined that the current average value has not increased (or decreased) from the previous average value (No in step S15), a counter is cleared (step S20), and the process is terminated. Specifically, it is determined whether or not the average value of the current values of the auxiliary pump 244 in the current preparing process has increased from the average value of the current values of the auxiliary pump 244 in the previous preparing process of the process recipe. If not so, the counter is cleared. In addition, it is determined whether or not the average value of the rotational speeds of the auxiliary pump 244 in the current preparing process has decreased from the average value of the rotational speeds of the auxiliary pump 244 in the previous preparing process of the process recipe. If not so, the counter is cleared. Further, it is determined whether or not the average value of the back pressures of the auxiliary pump 244 in the current preparing process has increased from the average value of the back pressures of the auxiliary pump 244 in the previous preparing process of the process recipe. If not so, the counter is cleared.

When it is determined that the current average value has increased (or decreased) from the previous average value (Yes in step S15), the counting is started (counter increment) (step S16). Then, it is determined whether or not the current average value has increased (or decreased) by a preset number of times in succession (step S17).

When it is determined that the current average value has not increased (or decreased) by the preset number of times in succession (No step S17), the process is terminated. When it is determined that the current average value has increased (or decreased) by the preset number of times in succession (Yes step S17), an alarm is generated, an alarm message is displayed on the display part 31, or an alarm message is notified to an external computer (for example, a host device) (step S18).

Specifically, when it is determined that the average value of the backpressures of the auxiliary pump 244 in the preparing process has increased from the average value of the backpressures of the auxiliary pump 244 acquired at the time of previous execution of the process recipe, the counting is started. When the back pressure of the auxiliary pump 244 tends to rise by a predetermined number of times, for example, five times, in succession, which is the set value of the monitoring parameter, an alarm is generated. This number of times is not particularly limited as long as the tendency of the monitoring parameter can be grasped. For example, it is configured to be set to three times or larger and seven times or smaller.

In addition, when it is determined that the average value of the current values of the auxiliary pump 244 in the preparing process has increased from the average value of the current values of the auxiliary pump 244 acquired at the time of previous execution of the process recipe, the counting is started. When the current value of the auxiliary pump 244 tends to rise by a predetermined number of times, for example, five times, in succession, which is the set value of the monitoring parameter, it is determined that the exhaust unit 310 is abnormal. For example, when the average value of the current values of the auxiliary pump 244 during the preparing process increases by five times in succession with 14.421 A at the 47-th batch, 14.528 A at the 48-th batch, 14.596 A at the 49-th batch, 14.660 A at the 50-th batch and 15.063 A at the 51-th batch (with the rotational speed of 6.879 krpm and the back pressure of 1.000 kPa), an alarm is generated.

Further, when it is determined that the average value of the rotational speeds of the auxiliary pump 244 in the preparing process has decreased from the average value of the rotational speeds of the auxiliary pump 244 acquired at the time of previous execution of the process recipe, the counting is started. For example, when the rotational speed of the auxiliary pump 244 tends to decrease by a predetermined number of times, for example, three times, in succession, which is the set value of the monitoring parameter, an alarm is generated.

That is, in comparison of at least one selected from the group of the average values of the current values, the rotational speeds and the back pressures of the auxiliary pump in the preparing process with the average values of the current values, the rotational speeds and the back pressures of the auxiliary pump in the previous preparing process, when the average value increases (or decreases) by a preset number of times, for example, three times or larger and seven times or smaller, in succession, an alarm is generated.

It has been illustrated in the present embodiments that an alarm is generated when at least one selected from the group of the average values of the current values, the rotational speeds and the back pressures of the auxiliary pump 244 increases or decreases by a preset number of times in succession from the previous average value. However, the present disclosure is not limited thereto. For example, when all the average values of the current values, the rotational speeds and the back pressures of the auxiliary pump 244 increase or decrease by a preset number of times in succession from the previous average value, an alarm may be generated. Alternatively, when two of the average values of the current values, the rotational speeds and the back pressures of the auxiliary pump 244 increase or decrease by a preset number of times in succession from the previous average values, an alarm may be generated. As a result, it is possible to grasp the tendency of the device data, particularly in the exhaust device and detect the indication of abnormality of the device data.

Then, after completion of the executed process recipe, the exhaust cleaning recipe is registered for execution (step S19). That is, after completing the executed process recipe, the exhaust cleaning recipe is reserved for execution. Then, the counter is cleared (step S20), and the process is terminated. For example, even if a film-forming process has not been performed a predetermined number of times, the exhaust cleaning recipe is executed. When the exhaust cleaning recipe is completed, the alarm may be released and the reserved process recipe may be executed next. Thus, it is possible to grasp the tendency of the device data, especially in the exhaust device and to avoid stoppage of the pump rotor due to blocking of the exhaust pipe and clogging of the pumps by removing by-products adhered to the exhaust device at an appropriate timing, thereby improving the device workability.

(8) Effects of the Present Embodiments

According to the present embodiments, one or more effects set forth below may be achieved.

(a) By efficiently grasping the tendency of parameters of the exhaust device to be monitored, it is possible to remove, for example, by-products adhered to the exhaust device at an appropriate timing, thereby improving the device workability.

(b) Since it is possible to grasp the tendency of the monitoring parameters of the exhaust device, it is possible to reliably perform maintenance before occurrence of an abnormality, thereby improving the device workability.

(c) By grasping the tendency of the monitoring parameters of the exhaust device, for example, it is possible to detect clogging caused by by-products adhered to the interior of the exhaust device before blocking of the exhaust pipe or before stoppage of the pump rotor due to clogging of the pumps.

(d) Since it is possible to grasp an indication of abnormality of the exhaust device to be monitored, it is possible to inform a user of an indication of blocking of the exhaust pipe or an indication of stoppage of the pump rotor due to clogging of the pumps by generating an alarm, displaying a message on the display part 31, displaying the contents of the alarm on the display part 31, or notifying a message to the host device. At the same time, it is possible to reserve the execution of the exhaust cleaning recipe and automatically execute the exhaust cleaning recipe when the executed process recipe is completed. As a result, it is possible to reliably remove by-products in the exhaust device before stoppage of the pump rotor due to blocking of the exhaust pipe or clogging of the pumps.

(e) In the exhaust cleaning recipe, since the by-products in the exhaust device are removed by passing the cleaning gas by the process chamber, it is unnecessary to execute a pretreatment recipe such as pre-coating before restarting the process recipe after completion of the exhaust cleaning recipe.

(f) In comparison of the average value of the device data in a predetermined specific step among the steps constituting the process recipe with the average value of the device data in the specific step calculated during previous execution of the process recipe, since an indication of stoppage of the pump rotor due to blocking of the exhaust pipe or clogging of the pumps is grasped, it is not necessary to set a threshold value.

(9) Other Configuration Examples

FIG. 7 is a view showing another configuration example. In this configuration example, an exhaust unit 310 is constituted by an exhaust pipe 231, an auxiliary pump 244, a main pump 246 and a detoxification device 248.

A substrate processing apparatus 100a includes a housing 111a installed on the third floor, and an auxiliary pump 244a, a main pump 246a and a detoxification device 248a installed on the first floor in order from the upstream side of gas flow. The housing 111a on the third floor and the auxiliary pump 244a on the first floor are connected by an exhaust pipe 231a.

A substrate processing apparatus 100b includes a housing 111b, an auxiliary pump 244b and a main pump 246b installed on the third floor from the upstream side of gas flow. A detoxification device 248b is installed on the first floor. A main pump 246b on the third floor and a detoxification device 248b on the first floor are connected by an exhaust pipe 231b.

A substrate processing apparatus 100c includes a housing 111c and an auxiliary pump 244c installed on the third floor. A main pump 246c and a detoxification device 248c are installed on the first floor in order from the upstream side of gas flow. The auxiliary pump 244c on the third floor and the main pump 246c on the first floor are connected by an exhaust pipe 231c.

That is, in addition to the case where the substrate processing apparatus 100 and the exhaust unit 310 are installed on the same floor, the present disclosure can be suitably applied to a case where at least portions of the substrate processing apparatus 100 and the exhaust unit 310 are installed on different floors, as in the substrate processing apparatuses 100a to 100c, in order to remove by-products adhered to the exhaust unit 310 at an appropriate timing, thereby improving the device workability.

Although the embodiments of the present disclosure have been concretely described above, the present disclosure is not limited to the above-described embodiments and examples, but various modifications can be made without departing from the spirit and scope of the present disclosure.

Further, an example in which a film is formed on the wafer 200 has been described in the above embodiments. However, the present disclosure is not limited to such embodiments. For example, in the above embodiments, a cleaning recipe for supplying a cleaning gas such as a halogen gas has been described, but a purge gas recipe for supplying a purge gas such as an inert gas or the like may be used.

Further, an example in which a film is formed by using a batch type vertical processing apparatus for processing a plurality of substrates at one time has been described in the above embodiments. However, the present disclosure is not limited thereto. Further, an example in which a thin film is formed using a substrate processing apparatus having a hot wall type process furnace has been described in the above embodiments. However, the present disclosure is not limited thereto. For example, the present disclosure can also be suitably applied to a case where a thin film is formed using a substrate processing apparatus having a cold wall type process furnace.

Further, the present disclosure is not limited to a semiconductor manufacturing apparatus for processing a semiconductor wafer, such as the substrate processing apparatus according to the embodiments. The present disclosure may also be applied to an LCD (Liquid Crystal Display) manufacturing apparatus for processing a glass substrate.

According to the present disclosure in some embodiments, it is possible to improve the device workability by removing by-products adhered to an exhaust device at an appropriate timing.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
a controller configured to execute a process recipe including a plurality of steps to perform a predetermined process on a substrate,
wherein the controller is configured to:
acquire device data, which includes at least one selected from the group of a current value of a pump, a rotational speed of the pump, and a back pressure of the pump, in a specific step among the plurality of steps;
compare an acquired value of the device data with a previously acquired value of the device data; and
generate a notification if at least one selected from the group of the following conditions is met:
(a) the acquired value for the current value is larger than the previously acquired value for the current value,
(b) the acquired value for the back pressure is larger than the previously acquired value for the back pressure, and
(c) the acquired value for the rotational speed is smaller than the previously acquired value for the rotational speed.

2. The substrate processing apparatus of claim 1, wherein comparing the acquired value of the device data with the previously acquired value of the device data is performed a plural number of times, and
wherein the notification is generated if in at least one selected from the group of (a) and (b), the acquired value has been increased in succession for a preset number of times of executing the process recipe.

3. The substrate processing apparatus of claim 1, wherein comparing the acquired value of the device data with the previously acquired value of the device data is performed a plural number of times, and
wherein the notification is generated if in (c), the acquired value has been decreased in succession for a preset number of times of executing the process recipe.

4. The substrate processing apparatus of claim 1, further comprising:
a storage configured to store the device data,
wherein the storage is configured to store at least one selected from the group of the process recipe, a cleaning recipe, a purge recipe.

5. The substrate processing apparatus of claim 4, wherein the controller is configured to execute the cleaning recipe after the process recipe is completed.

6. The substrate processing apparatus of claim 4, wherein the controller is configured to execute the cleaning recipe when generating the notification.

7. The substrate processing apparatus of claim 4, wherein the cleaning recipe includes at least one selected from the group of a first cleaning recipe and a second cleaning recipe, and
wherein the first cleaning recipe is a recipe for directly supplying a cleaning gas to an exhaust pipe by passing the cleaning gas by a process chamber for processing the substrate.

8. The substrate processing apparatus of claim 1, wherein the process recipe includes at least a substrate-loading step, a preparing step, a film-forming step, a purging step and a substrate-unloading step, and
wherein, prior to the film-forming step, the specific step is selected from the substrate-loading step and the preparing step.

9. The substrate processing apparatus of claim 1, wherein the specific step is a process of starting evacuation from an atmospheric pressure.

10. The substrate processing apparatus of claim 1, wherein the controller is configured to acquire a maximum value of the device data in the specific step.

11. The substrate processing apparatus of claim 1, wherein the controller is configured to calculate an average value of the device data in the specific step.

12. The substrate processing apparatus of claim 1, wherein the device data comprises at least two device data selected from the group of the current value of the pump, the rotational speed of the pump, and the back pressure of the pump.

13. The substrate processing apparatus of claim 1, further comprising:
a display configured to display contents of the notification thereon.

14. The substrate processing apparatus of claim 1, wherein the controller is configured to generate the notification if at least two of the conditions are met.

15. The substrate processing apparatus of claim 1, wherein the controller is configured to generate the notification when at least one selected from the group of the conditions changes.

16. The substrate processing apparatus of claim 1, wherein the device data is acquired while executing the process recipe.

17. The substrate processing apparatus of claim 1, wherein the pump includes at least one selected from the group of an auxiliary pump and a main pump, and
wherein the auxiliary pump is located from the apparatus within a first distance, and the main pump is located from the apparatus with a second distance larger than the first distance.

18. A non-transitory computer-readable recording medium storing a program that causes a controller to execute a process recipe including a plurality of steps to perform a predetermined process on a substrate, wherein the controller is configured to:
acquire device data, which includes at least one selected from the group of a current value of a pump, a rotational speed of the pump, and a back pressure of the pump, in a specific step among the plurality of steps;
compare an acquired value of the device data with a previously acquired value of the device data; and
generate a notification if at least one selected from the group of the following conditions is met:
(a) the acquired value for the current value is larger than the previously acquired value for the current value,
(b) the acquired value for the back pressure is larger than the previously acquired value for the back pressure, and
(c) the acquired value for the rotational speed is smaller than the previously acquired value for the rotational speed.

19. A method of manufacturing a semiconductor device, the method comprising:
acquiring device data, which includes at least one of a current value of a pump, a rotational speed of the pump, and a back pressure of the pump, in a predetermined specific step among a plurality of steps constituting a process recipe, comparing an acquired value for each of the device data with a previous value for each of the device data acquired in the specific step during previous execution of the process recipe, and generating a notification if it is determined that at least one of the following conditions is met:
- the acquired value for the current value is larger than the previous value for the current value and has been increased in succession for a preset number of times of executing the process recipe,
- the acquired value for the back pressure is larger than the previous value for the back pressure and has been increased in succession for a preset number of times of executing the process recipe, and
- the acquired value for the rotational speed is smaller than the previous value for the rotational speed and has been decreased in succession for a preset number of times of executing the process recipe.

* * * * *